US007221231B2

(12) United States Patent
Camparo et al.

(10) Patent No.: US 7,221,231 B2

(45) Date of Patent: May 22, 2007

(54) DISCHARGE LAMP STABILIZATION SYSTEM

(75) Inventors: James C. Camparo, Redondo Beach, CA (US); Charles M. Klimcak, Palos Verdes Estates, CA (US)

(73) Assignee: The Aerospace Corporation, El Segundo, CA (US)

(*) Notice: Subject to any disclaimer, the term of this patent is extended or adjusted under 35 U.S.C. 154(b) by 171 days.

(21) Appl. No.: 11/179,442

(22) Filed: Jul. 11, 2005

(65) Prior Publication Data

US 2007/0008045 A1 Jan. 11, 2007

(51) Int. Cl.
*H03B 17/00* (2006.01)

(52) U.S. Cl. ........................................ 331/94.1; 331/66

(58) Field of Classification Search .................... 331/3, 331/66, 94.1
See application file for complete search history.

(56) References Cited

U.S. PATENT DOCUMENTS

2007/0008045 A1* 1/2007 Camparo et al. .......... 331/94.1

* cited by examiner

*Primary Examiner*—David Mis
(74) *Attorney, Agent, or Firm*—Derrick Michael Reid

(57) ABSTRACT

An RF-discharge lamp stabilization system for preferred use in a Rubidium atomic clock, senses acoustic oscillations of plasma ions in the 20.0 kHz range to assess the performance of the lamp for determining radio frequency parameters of the lamp while the lamp is in operation and while the performance of an atomic clock is influenced by the plasma character, with lamp spectral outputs being actively stabilized for improved vapor-cell clock performance.

7 Claims, 2 Drawing Sheets

DISCHARGE LAMP STABILIZATION SYSTEM

DISCHARGE LAMP STABILIZATION SYSTEM

LAMP DRIVE FREQUENCY CHARACTERIZATION

LAMP DRIVE POWER CHARACTERIZATION

DISCHARGE LAMP STABILIZATION SYSTEM

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of atomic clocks. More particularly, the invention relates to a discharge lamp stabilization system for use in atomic clocks.

BACKGROUND OF THE INVENTION

Vapor-cell atomic clocks employ an RF-discharge lamp to generate the atomic clock signal. As a consequence, the performance of the atomic clock depends on the spectral output of the RF-discharge lamp, which in turn is determined by the detailed properties of the light-generating plasma within the lamp. The light emission characteristics of discharge lamps can change slowly over time, and this can affect the accuracy of the atomic clock.

All clocks measure time intervals by determining the elapsed phase of some stable oscillation. Every precision clock requires a precision frequency standard. Consequently, variations in a reference oscillator frequency, $\Delta\omega_{clk}$ (t), will give rise to time-interval errors. The oscillator frequency provides a tick-rate for the clock, and errors in the tick-rate imply that the clock is running too fast or too slow. In a crystal clock, the oscillation frequency is defined by the output of a free-running quartz crystal oscillator. As is well known, the free-running oscillations may be perturbed by oscillator temperature variations, pressure variations, and radiation. In the case of an atomic clock, the output frequency of the crystal is locked to an atomic resonance so that the determination of time-intervals takes on the stability of an atomic energy-level structure. As a consequence, atomic clocks are much less sensitive to the effects of temperature, pressure, and radiation.

A magnetic dipole interaction exists in Rubidium between the single orbiting valence electron and the atomic nucleus of the Rubidium atom. This subatomic magnetic interaction, termed the hyperfine interaction, causes the electronic and nuclear magnetic moments to align either parallel or antiparallel with one another. In order to employ this interaction for precise timekeeping, the output frequency of a quartz crystal oscillator at about 10.0 MHz is first multiplied up into the microwave regime and then modulated at some low frequency. The microwave signal at 6834.7 MHz then interacts with a vapor of $Rb^{87}$ atoms, probing the hyperfine interaction by causing the atoms to switch, back and forth, between two hyperfine states, that is, the electronic and nuclear magnetic moments are first parallel, then antiparallel, now parallel again, and so on. The probing process can detect very small microwave frequency excursions from the center frequency of 6834.7 MHz because the Q of the response of the Rubidium atoms to the probing process is very high, on the order of $10^7$. Employing phase-sensitive-detection, a feedback correction signal is derived from the probing process and is used to lock the crystal oscillator output frequency to the hyperfine interaction of the $Rb^{87}$ atoms.

A Rubidium atomic clock system using a generic vapor-phase atomic clock design includes a Rb RF-discharge lamp that is excited by a $10^2$ MHz signal $v_{rf}$, a filter cell containing $Rb^{85}$ vapor, a resonance cell containing $Rb^{87}$ vapor, and a photodetector. The Rb lamp emits spectral lines in the near-IR, at 780 nm and 795 nm, also known as the lamp emission. After passing through the $Rb^{85}$ vapor in the filter cell, the spectrum of the lamp emission is altered slightly so that the light can efficiently generate an atomic clock signal. The filtered lamplight prepares the atoms in the $Rb^{87}$ resonance cell for interaction with microwaves in a process known as optical pumping, and additionally monitors the $Rb^{87}$ atomic interaction with the microwaves. The $Rb^{87}$ atomic response to the microwaves is the essential atomic clock signal. When the microwaves are tuned to the appropriate frequency, so that the $Rb^{87}$ atoms strongly absorb the microwaves, the intensity of lamplight transmitted by the resonance cell decreases. When the microwave frequency is not tuned appropriately, the $Rb^{87}$ atoms do not absorb the microwaves and the intensity of the transmitted lamplight remains unaffected. As such, the microwaves must be within about one part in $10^7$ of the resonance frequency of the $Rb^{87}$ Rubidium atoms in order to affect the transmission of the lamplight through the resonance cell.

In addition to producing the atomic clock signal, the lamplight disadvantageously slightly perturbs the atoms, altering the atoms natural microwave absorption resonance frequency and thereby the atomic clock frequency $\omega_{clk}$. This phenomenon is known as the light shift effect. The light shift effect depends on the intensity and spectrum of the lamplight. The light shift effect is an important effect in determining atomic clock performance. In particular, recent GPS on-orbit clock data clearly show that the lamp intensity can experience relatively sudden changes, which in turn disadvantageously give rise to sudden changes in the frequency of the clock. As a consequence, stabilization of the lamp emission results in stabilization of the atomic clock frequency, which in turn results in stabilization of the tick-rate of the clock and hence the ability of the clock to keep accurate time.

The RF-discharge lamp generates light via a weakly ionized alkali and noble-gas plasma. The plasma can generate acoustic ion waves, which are essentially bulk motions of the positive ions in the plasma. Under normal lamp operating conditions, where the Debye length is very small, at about $10^{-3}$ cm, the frequency of these acoustic ion waves, $f_{aco}$, follows a relatively simple dispersion law defined by a dispersion equation $f_{aco} \cong \sqrt{(KT_e/M_{ion}\lambda^2)}$. In the dispersion law, $T_e$ is the effective plasma electron temperature, $M_{ion}$ is the ion mass, and $\lambda$ is the wavelength of the plasma oscillation. With $T_e$ equal $2\times10^3$°K, $M_{ion}$ equal to 100 gms/mole, and $\lambda$ equal to 2 L, where L is equal 1.5 cm and is the length of the lamp, the frequency $f_{aco}$ of the acoustic ion waves is 14 kHz. The frequency $f_{aco}$ of the acoustic ion waves depends on the electron temperature. The electron temperature will change over time as more or less RF power is coupled into the plasma. As such, the frequency $f_{aco}$ of the acoustic ion waves will vary with time as the plasma temperature and power changes over time. The plasma temperature and power changes also affect the lamplight, leading to poor atomic clock performance via the light shift effect. The plasma temperature and power changes of the RF-discharge lamp have not been characterized nor stabilized in an atomic clock system leading to inaccurate atomic clock performance. These and other disadvantages are solved or reduced using the invention.

SUMMARY OF THE INVENTION

An object of the invention is to provide a system for picking off acoustic ion oscillations of a discharge lamp.

Another object of the invention is to provide a system for picking off acoustic ion oscillations of a discharge lamp for stabilizing the power input to the discharge lamp for stabilizing the lamp emission.

Yet another object of the invention is to provide a system for picking off acoustic ion oscillations of a discharge lamp for stabilizing the temperature of the discharge lamp for stabilizing the lamp emission.

Still another object of the invention is to provide a system for picking off acoustic ion oscillations of a discharge lamp for stabilizing the discharge lamp for stabilizing the lamp emission.

A further object of the invention is to provide a system for picking off acoustic ion oscillations of a discharge lamp for stabilizing the discharge lamp for stabilizing the lamp emission for stabilizing an atomic clock.

The invention is a system for acoustic plasma oscillation stabilization. The system can be used for assessing RF-discharge lamp characteristics used in atomic clocks. The system is directed to an RF-discharge lamp stabilization system that senses acoustic oscillations of the plasma ions in the 20.0 kHz range. The acoustic oscillation can be sensed and the power, frequency, and temperature of the RF-discharge lamp can be adjusted for improving the performance of the atomic clock by locking the acoustic oscillation frequency of the plasma ions to a specific value in the 20.0 kHz range.

The acoustic ion waves frequency $f_{aco}$ can be observed as sidebands on the $10^2$ MHz RF signal by placing a small pick-up coil in the vicinity of the lamp. The acoustic ion waves frequency $f_{aco}$ can also be observed as a modulation of the lamp emission at $f_{aco}$. The observation of the acoustic ion oscillations provides direct access to the electron temperature of the plasma. The frequency of the acoustic ion oscillations can be used to measure the amount of power coupled into the plasma, and hence characterize the RF performance characteristics of the RF-discharge lamp. Changes in the frequency of the acoustic ion oscillations can be used to actively stabilize the ion oscillation frequency in a feedback loop by adjusting the radio frequency power fed into the circuit for stabilizing the electron temperature of the plasma and the spectral character of the RF-discharge lamp. These and other advantages will become more apparent from the following detailed description of the preferred embodiment.

DETAILED DESCRIPTION OF THE PREFERRED EMBODIMENT

Figure 1:
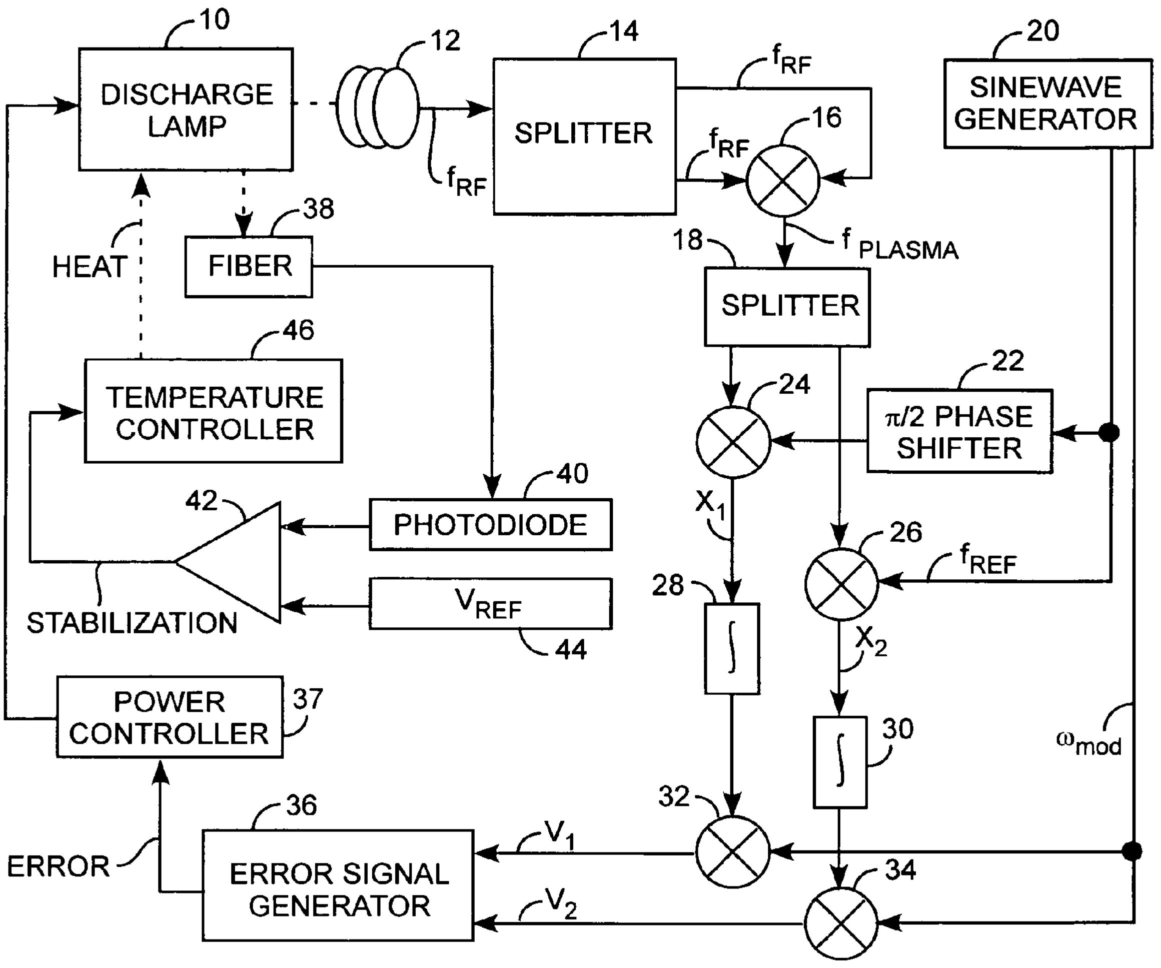
FIG. 1 is a block of a discharge lamp stabilization system.

An embodiment of the invention is described with reference to the figures using reference designations as shown in the figures. Referring to all of the Figures, a discharge lamp 10 is part of a resonant RF circuit that generates an RF signal $f_{RF}$ at 83 MHz. A pick-up coil 12 is placed around the glass envelope, not shown, of the lamp 10, and detects the 83 MHz RF signal $f_{RF}$ along with the acoustical ion oscillation sideband signals. The RF signal from the coil 12 is split by a splitter 14 and squared in a mixer 16 for providing a $f_{plasma}$ signal that is then split by a splitter 18. The splitters split the signal into two identical signals and the mixers multiply the two inputs. The mixer 16 downconverts the acoustical ion oscillation sideband-signal to baseband.

A sinewave generator 20 provides a $f_{REF}$ signal and a $\pi/2$ phase shifted $f_{REF}$ signal to respective mixers 26 and 24 for providing an inphase $X_1$ signal and a quadrature $X_2$ signal. The inphase $X_1$ signal and the quadrature $X_2$ signal are respectively integrated by integrators 28 and 30 for respectively providing an inphase integrated signal and a quadrature integrated signal. The integrators sum the signal over a time interval that is determined by the electrical characteristics of the integrator circuit. The sinewave generator 20 also modulates the $f_{REF}$ signal at a rate governed by a modulation signal $\omega_{mod}$ and communicates the modulation signal $\omega_{mod}$ to mixers 32 and 34 for demodulating the inphase integrated signal and the quadrature integrated signal for respectively providing signals $V_1$ and $V_2$. The signals $V_1$ and $V_2$ are fed into an error signal generator 36 for providing an error signal that is fed to a power controller 37 used for controlling the RF power input to the discharge lamp 10 for stabilizing the frequency of the acoustic ion waves. An optical fiber 38 can be used to pick off light from the discharge lamp. The picked off light is directed to a photodiode 40 for providing a detection signal to an amplifier 42 that also receives a voltage reference $V_{REF}$. The amplifier 42 provides a stabilization signal to a temperature controller 46 for controlling through heat the temperature of the lamp. The error signal from the error signal generator 36 and the stabilization signal from the amplifier 42 are used to respectively control the RF power and temperature of the lamp 10, producing stable lamp emission. The stable lamp emission can be used to generate a stable atomic signal in an atomic clock, and thereby a stable tick-rate for the clock.

The pick off coil 12 can be used to characterize an RF-discharge lamp while the lamp is in operation. The pick off coil 12 accesses the RF power and temperature of the lamp through sensing the acoustic ion oscillations of the plasma. In particular, the system measures the electron temperature of the plasma that can then be stabilized for stabilized operation of the lamp to reduce variations of the lamp emission. Demodulating $V_1$ and $V_2$ yields an error signal that can be used to adjust the RF power into the lamp in order to stabilize the ion oscillation frequency to a frequency $f_o$ provided by the sinewave generator 20.

Figure 2:
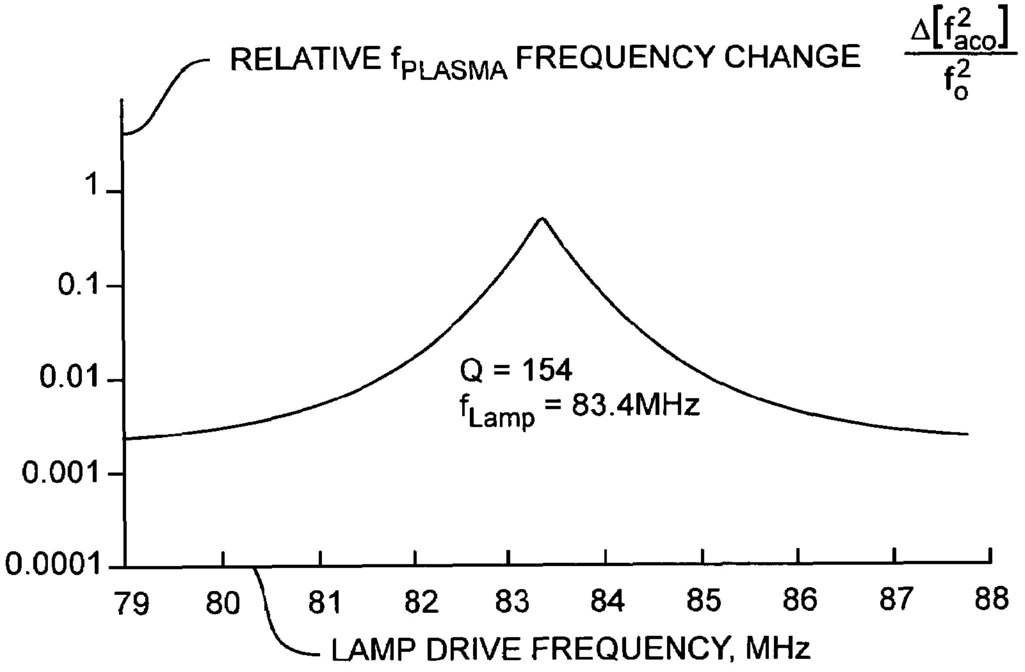
FIG. 2 is a graph of lamp drive frequency characterization.
Figure 3:
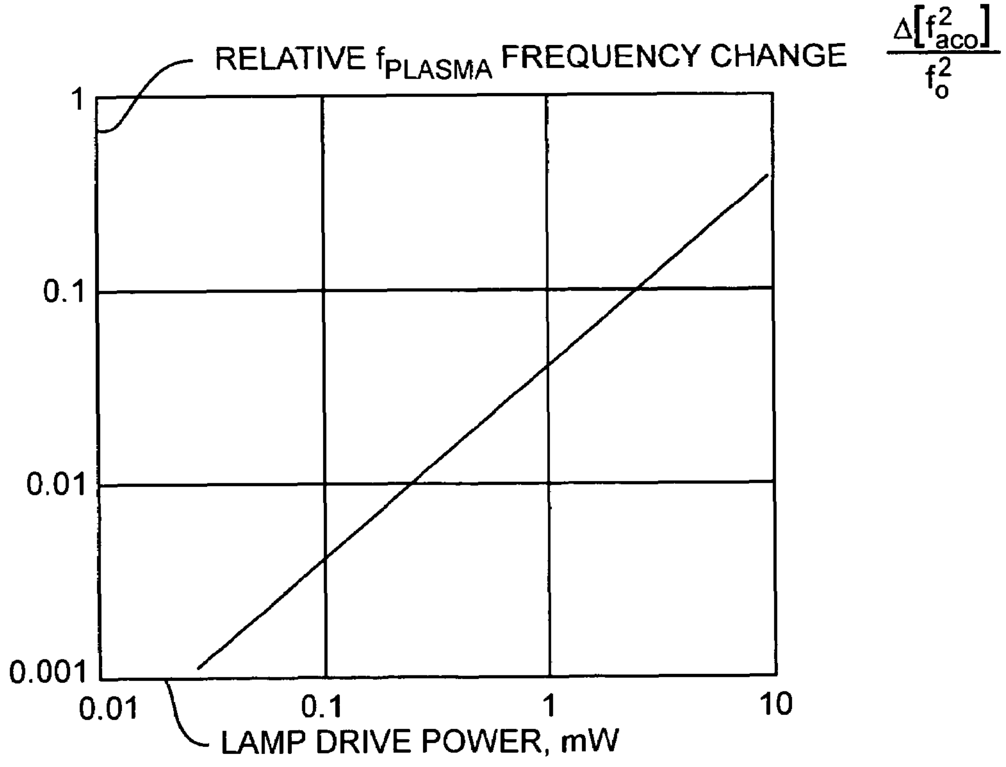
FIG. 3 is a graph of lamp drive power characterization.

To provide a lamp drive frequency characterization, a secondary RF signal, not shown, can be launched into the lamp 10 using a launch coil, not shown, as a probe signal. The ion oscillation frequency has a resonance as the frequency of the probe signal is varied. As the probe signal approaches the resonant frequency of the RF-discharge lamp and associated electronics 10 at about 83.3 MHz, more RF power is coupled into the lamp 10, increasing the electron temperature and shifting the ion oscillation frequency to higher values. Based on a dispersion equation $f_{aco} \cong \sqrt{(KT_e/M_{ion}\lambda^2)}$, the relative change in the $f_{PLASMA}$ ion oscillation frequency (also known as $f_{aco}$) scales with the relative change in the RF probe signal power. The RF probe signal power is defined by a probe power equation $\Delta[f_{aco}^2]/f_o^2 = (f_{aco}^2 - f_o^2)/f_o^2 \cong \delta P_{rf}/T_e$. In the probe power equation, $f_o^2$ is the square of the ion oscillation frequency in the absence of the RF probe signal, $f_{aco}^2$ is the square of the ion oscillation frequency when the RF probe signal is present, and $\delta P_{RF}$ is the excess RF power supplied to the lamp by the probe. Thus, so long as the probe power only changes the electron temperature minimally, so that the $T_e$ term in the probe power equation is essentially independent of the probe, then the change in the ion oscillation frequency will provide a measure of RF power coupling into the discharge lamp. As shown in FIG. 3 the relationship embodied by the probe power equation is verified by the relative change in the squared ion oscillation frequency as a function of the RF power of the probe signal using a probe signal frequency of 82 MHz. The relative $f_{PLASMA}$ frequency change, $\Delta[f_{aco}^2]/f_o^2$, as a function of the probe frequency $V_{rf}$ of the probe signal is shown in FIG. 2. Performing a nonlinear least squares fit, the resonant frequency $f_{LAMP}$ of the lamp and quality factor Q can be determined, for example, $f_{LAMP}$=83.4 MHz and Q=154.

The system can be used to control two parameters of the lamp while the lamp is in operation, including lamp temperature and lamp RF power. The acoustic ion wave frequency $f_{aco}$ can be observed as sidebands on the $10^2$ MHz RF signal by placing a small pick-up coil in the vicinity of the lamp. The pick-up coil observation of the frequency changes of the acoustic ion oscillations provides direct access to the electron temperature of the plasma. The frequency changes of the acoustic ion oscillations can be used to measure the amount of RF power coupled into the plasma, and hence characterize the RF performance characteristics of the RF-discharge lamp. The frequency changes of the acoustic ion oscillations can be used to actively stabilize the ion oscillation frequency in a feedback loop by adjusting the RF power fed into the circuit for stabilizing the plasma electron temperature and thereby stabilize the spectral character of the RF-discharge lamp. Those skilled in the art can make enhancements, improvements, and modifications to the invention, and these enhancements, improvements, and modifications may nonetheless fall within the spirit and scope of the following claims.

What is claimed is:

1. A system for stabilizing acoustic ion oscillations of an RF discharge lamp, the system comprising, a pick off coil or other detector for picking off a radio frequency or first optical signal containing information on the acoustic ion oscillations, a squarer for squaring the radio frequency or first optical signal for generating an acoustic ion oscillation signal, and a power generator for receiving the acoustic ion oscillation signal and generating input power for controlling the power of the lamp for reducing variations of the acoustic ion oscillation signal for stabilizing the lamp emission.

2. The system of claim 1 wherein, the radio frequency or first optical signal is a probe signal, and the system is an atomic clock.

3. The system of claim 1 wherein the squarer comprises, a splitter for splitting the radio frequency or first optical signal into two replicas, and a mixer for mixing together the two replicas for providing the acoustic ion oscillation signal.

4. The system of claim 1 wherein the power generator comprises, a splitter for splitting the acoustic ion oscillation signal in quadrature as an inphase acoustic ion oscillation signal and a quadrature acoustic ion oscillation signal, two mixers for modulating the inphase acoustic ion oscillation signal and a quadrature acoustic ion oscillation signal into modulated quadrature signals, two integrators for respectively integrating the modulated quadrature signals into integrated signals, two mixers for demodulating the integrated signals into demodulated signals, an error signal generator for generating an error signal from the demodulated signals, and a power controller for controlling the input power by the error signal.

5. The system of claim 1 further comprising, a temperature stabilizer for sensing a second optical signal and controlling the temperature of the lamp for stabilizing the second optical signal.

6. The system of claim 1 further comprising a temperature stabilizer for sensing the second optical signal and controlling the temperature of the lamp for stabilizing the second optical signal, the temperature stabilizer comprising, an optical fiber for sensing the second optical signal, a photodetector for detecting the second optical signal and providing an electrical signal, and a temperature controller for receiving the electrical signal and providing heat to heat the lamp to stabilize the second optical signal.

7. The system of claim 6 wherein, the second optical signal is a probe signal, and the system is an atomic clock.

* * * * *